United States Patent
Tsironis

(10) Patent No.: US 10,444,266 B1
(45) Date of Patent: Oct. 15, 2019

(54) HYBRID SPLIT SIGNAL LOAD PULL SYSTEM WITH WAVE-PROBE

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 241 days.

(21) Appl. No.: 15/681,975

(22) Filed: Aug. 21, 2017

Related U.S. Application Data

(60) Provisional application No. 62/377,923, filed on Aug. 22, 2016.

(51) Int. Cl.
| | | |
|---|---|---|
| G01R 21/133 | (2006.01) | |
| G01R 27/32 | (2006.01) | |
| G01R 31/28 | (2006.01) | |
| G01R 31/26 | (2014.01) | |

(52) U.S. Cl.
CPC ........... *G01R 21/133* (2013.01); *G01R 27/32* (2013.01); *G01R 31/2608* (2013.01); *G01R 31/2822* (2013.01)

(58) Field of Classification Search
CPC .. G01R 21/133; G01R 31/2608; G01R 27/32; G01R 31/2822
See application file for complete search history.

(56) References Cited

U.S. PATENT DOCUMENTS

| | | | |
|---|---|---|---|
| 6,509,743 B1 | 1/2003 | Ferrero | |
| 6,639,393 B2 | 10/2003 | Tasker | |
| 6,674,293 B1 | 1/2004 | Tsironis | |
| 6,812,714 B2 | 11/2004 | Verspecht | |
| 7,486,067 B2 | 2/2009 | Bossche | |
| 8,497,689 B1 | 7/2013 | Tsironis | |
| 2007/0182424 A1* | 8/2007 | Benedikt | G01R 27/32 324/637 |

OTHER PUBLICATIONS

Fadhel M. Ghannouchi et al., Load-Pull Techniques with Applications to Power Amplifier Design, Springer, 2013, Chapter 3, Active Load-Pull Systems, pp. 68-76 (Year: 2013).*
Simpson, A Beginner's Guide to All Things Load Pull, Mar. 2015 (Year: 2015).*
Ghannouchi, A New Multiharmonic Loading Method for Large-Signal Microwave and Millimeter-Wave Transistor Characterization, IEEE Transactions on Microwave Theory and Techniques, vol. 39, No. 6, Jun. 1991 (Year: 1991).*

(Continued)

*Primary Examiner* — Daniel R Miller

(57) ABSTRACT

A hybrid, fundamental and harmonic frequency, active injection load pull test setup includes a harmonic receiver, impedance tuners and operates using only a single power source at the fundamental frequency Fo whereby the signal is split between input and output signal path. The output signal portion is retrieved through the coupled port of an adjustable wave-probe, which is incorporated into the input tuner and attached on the vertical axis of one of the tuner's mobile carriages. Wideband and harmonic impedance tuners serve for pre-matching the DUT output and reducing the injection power requirement; the amplitude and phase control in the feedback loop uses the variable wave-probe coupler mounted inside the source tuner.

8 Claims, 11 Drawing Sheets

(56) References Cited

OTHER PUBLICATIONS

Simon Mathias, Load pull system pros and cons, available at https://www.microwavejournal.com/blogs/10-tek-talk/post/17056-load-pull-system-pros-and-cons, Feb. 2012 (Year: 2012).*
"Load Pull", [online], Wikipedia [Retrieved on Nov. 18, 2016] Retrieved from Internet <URL: http://en.wikipedia.org/wiki/Load_pull>.
"Computer Controlled Microwave Tuner—CCMT," Product Note 41, Focus Microwaves Inc., Jan. 1998.
"A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http://ieeexplore.ieee.org/document/1123701/>.
"Overcoming Nonlinear Measurement Challenges," Application Note, [online], Tektronix Corp, [Retrieved on Sep. 2, 2016]. Retrieved from Internet <URL: http://www.tek.com/document/application-note/overcoming-nonlinear-measurement-challenges>.
N5242A PNA-X Microwave Network Analyzer, 26.5 GHz, [online], [Retrieved on Aug. 17, 2017]. Retrieved from Internet <URL: http://www.keysight.com/en/pdx-x202277-pn-N5242A/pna-x-microwave-network-analyzer-265-ghz?nid=-32497.1150434&cc=CA&lc=eng&pm=ov>.
Rohde & Schwarz Vector Network Analyzer [online], {Retrieved on Aug. 18, 2017], Retrieved from Internet <URL:http://www.rohde-schwarz.com/en/product/zva-productstartpage_63493-9660.html>.
"MPT, a universal Multi-Purpose Tuner", product note 79, Focus Microwaves Inc., Oct. 2004.
Tsironis, U.S. Appl. No. 14/564,396, "Hybrid Split Signal Load Pull System".

* cited by examiner

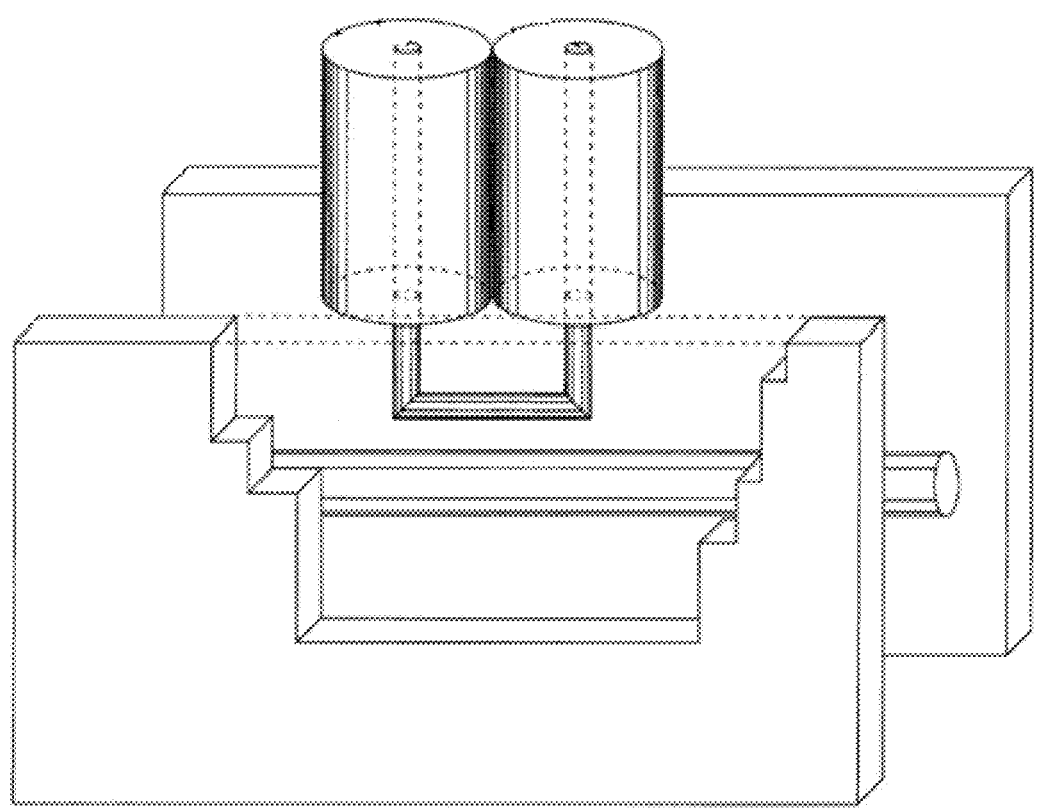
FIG. 6: Prior art

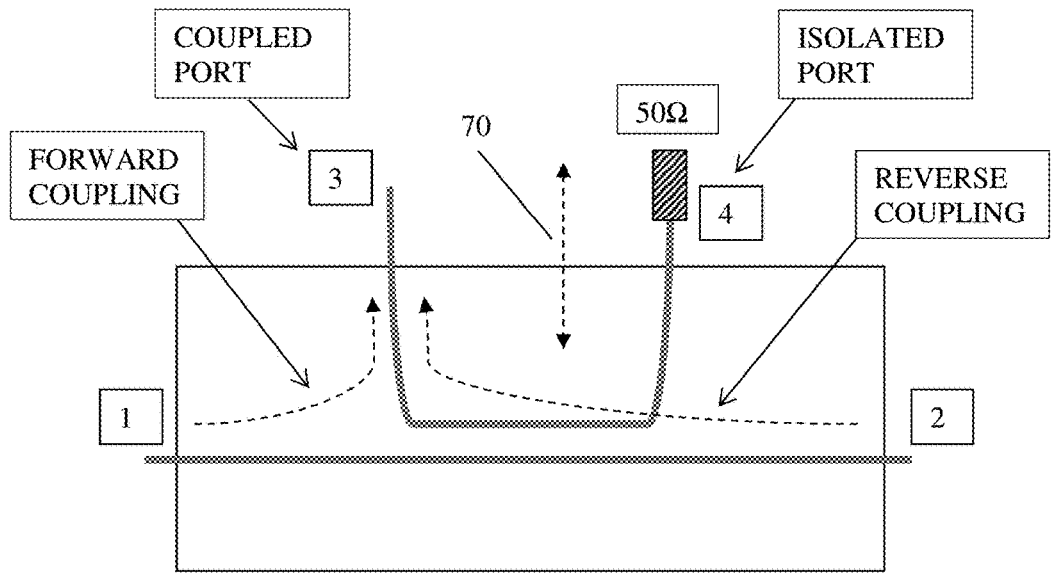
FIG. 7A: Prior art
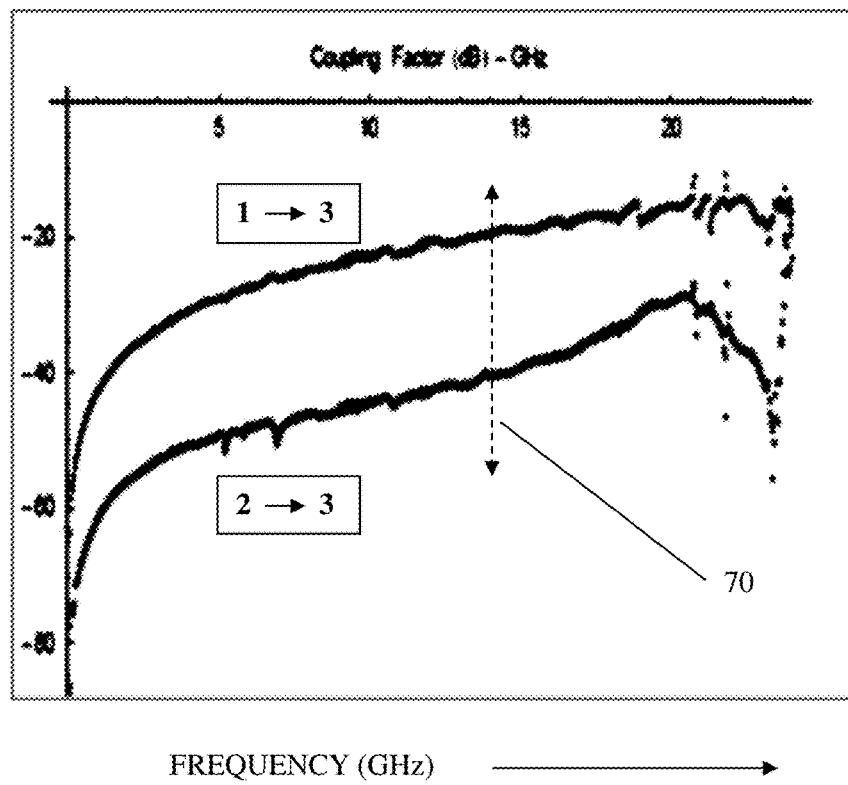
FIG. 7B: Prior art

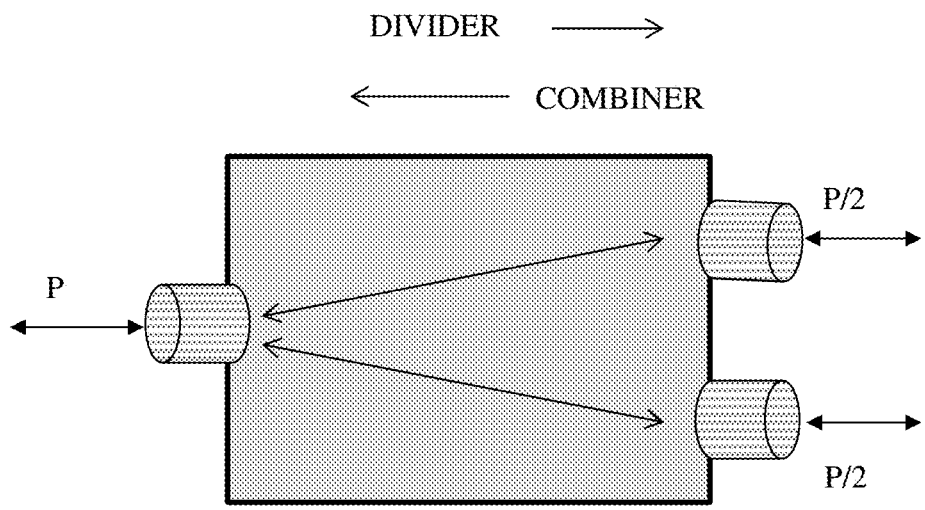
FIG. 8A: Prior art
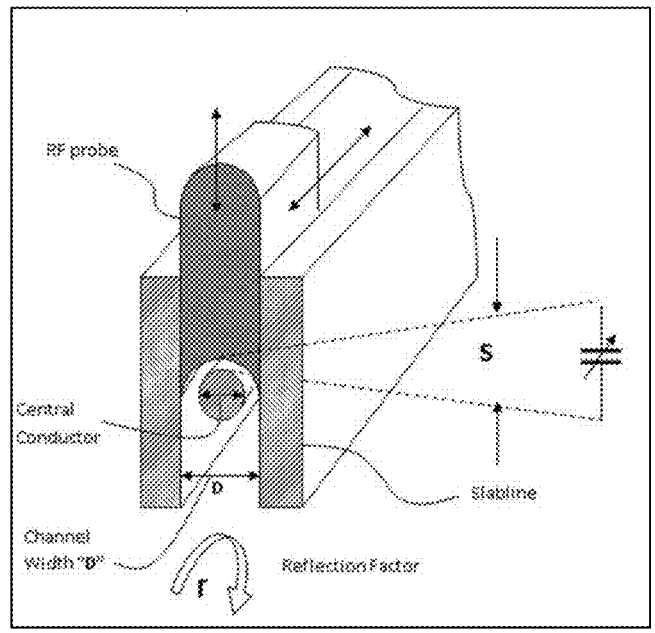
FIG. 8B: Prior art

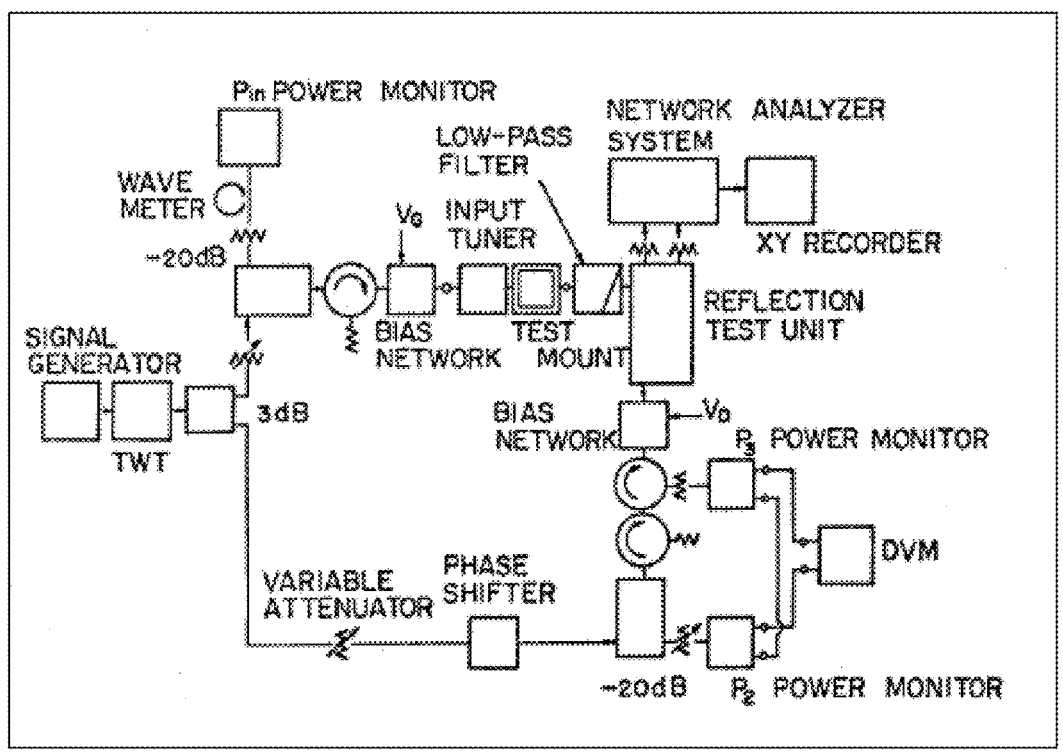
FIG.11: Prior art

US 10,444,266 B1

HYBRID SPLIT SIGNAL LOAD PULL SYSTEM WITH WAVE-PROBE

PRIORITY CLAIM

This application claims priority on provisional application 62/377,923 filed on Aug. 22, 2016 and titled "Hybrid Split Signal Load Pull System with Wave-probe".

CROSS-REFERENCE TO RELATED ARTICLES

1. "Load Pull", [online], Wikipedia [Retrieved on Nov. 18, 2016] Retrieved from Internet <URL: http://en.wikipedia.org/wiki/Load_pull>.
2. "Computer Controlled Microwave Tuner—CCMT," Product Note 41, Focus Microwaves Inc., January 1998.
3. "A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on 2017 Apr. 6]. Retrieved from Internet <URL: http://ieeexplore.ieee.org/document/1123701/>.
4. "Overcoming Nonlinear Measurement Challenges," Application Note, [online], Tektronix Corp, [Retrieved on Sep. 2, 2016]. Retrieved from Internet <URL: http://www.tek.com/document/application-note/overcoming-nonlinear-measurement-challenges>.
5. TSIRONIS, U.S. Pat. No. 8,497,689, "Method for reducing power requirements in active load pull systems."
6. FERRERO, U.S. Pat. No. 6,509,743, "Active load or source impedance synthesis apparatus for measurement test set of microwave components and systems."
7. N5242A PNA-X Microwave Network Analyzer, 26.5 GHz, [online], [Retrieved on Aug. 17, 2017]. Retrieved from Internet <URL: http://www.keysight.com/en/pdx-x202277-pn-N5242A/pna-x-microwave-network-analyzer-265-ghz?nid=-32497.1150434&cc=CA&lc=eng&pm=ov>.
8. Rohde & Schwarz Vector Network Analyzer [online], {Retrieved on Aug. 18, 2017], Retrieved from Internet <URL: http://www.rohde-schwarz.com/en/product/zva-productstartpage_63493-9660.html>.
9. VANDEN BOSSCHE, U.S. Pat. No. 7,486,067, "Real-time device characterization and analysis."
10. TASKER et al, U.S. Pat. No. 6,639,393, "Methods and apparatus for time-domain measurement with a high frequency circuit analyzer."
11. VERSPECHT et al, U.S. Pat. No. 6,812,714, "Apparatus for collecting signal measurement data at signal ports of an RF and microwave device-under-test, under different impedance load conditions."
12. "MPT, a universal Multi-Purpose Tuner", product note 79, Focus Microwaves Inc., October 2004
13. TSIRONIS, U.S. Pat. No. 6,674,293, "Adaptable pre-matched tuner system and method."
14. TSIRONIS, U.S. patent application Ser. No. 14/564,396, "Hybrid Split Signal Load Pull System".

BACKGROUND OF THE INVENTION

This invention relates to testing and characterization of microwave high power transistors and amplifiers (device under test, DUT); the test system disclosed here allows for testing a DUT through acquisition and processing of its RF characteristics, typically gain, output power, efficiency, intermodulation etc., under precise source and load impedance conditions at the fundamental and harmonic frequencies (see ref. 1); reflection factors Γ up to and exceeding |Γ|=1 using a single fundamental frequency signal source and a single power amplifier for both input and output power injection are possible.

DESCRIPTION OF PRIOR ART

Traditional passive load pull systems (FIG. 1) comprise a signal source (1), which may include a driver amplifier (not shown), an input impedance tuner (2) a DUT (Device Under Test) in a test fixture (3), an output impedance tuner (4) and a microwave power sensor (5). The injected power is measured at a coupled port (6) at the input, and the output power at the power meter (sensor) (5). Additional components, such as bias tees, attenuators, filters and couplers, as well as instruments such as power supplies and spectrum analyzers are also used but do not change the basic concept. The DUT's characteristics are measured as a function of source and load impedances generated by the tuners (2) and (4) at the operating (fundamental, Fo) frequency and a number of harmonic frequencies (2Fo, 3Fo . . . ). The total is controlled by a system computer (11), which uses control links (7), (8) to the tuners (2), (4) and communication links (9), (12) with the instruments for configuring, triggering and data acquisition (see ref. 1).

The reflection factors (20), FIG. 2, created by the impedance tuners cover, typically, the largest part of the reflection factor plan (Smith chart), (21); FIG. 2 shows typical calibration points; appropriate tuning and interpolation algorithms (see ref. 2) between the calibration points allow creating almost every impedance within the tuning range (shadowed areas in FIG. 3); the insertion loss between DUT and tuner (segments (10) in FIG. 1) reduces the effective tuning range (33) at the DUT ports (small shadowed area) compared with the "tuning range at tuner port" (32); therefore the actual tuning capacity of such a "passive" tuner system is shown in FIG. 3 as "tuning range at DUT port"). However, many power transistors (DUT) need to be matched at impedances shown as dots (30) or (31) in FIG. 3. In the first case (30) a minimization of the test fixture and interconnection loss (10) might allow the tuner to reach this point (30). But in many other cases, like in the case of dot (31) this is simply impossible using a passive tuner system. In this case an "active" solution is necessary. This is shown in FIG. 4; in this case a second signal (42), coherent (synchronized) with the signal (41) delivered into the DUT (43) at its input port and by the DUT at its output port (Pdut), is injected into the output port of the DUT; the phase and amplitude of the second signal (42) is adjusted, such as to generate a virtual load to the DUT, which, depending on the relative phase between the signal injected into and exiting from the DUT output port, can reach a reflection factor larger than the reflection factor generated by the passive tuner alone (see ref. 4 and 5).

The basic concept of a prior art open-loop active injection load pull system (see ref. 5, 9, 10 and 11) comprises a harmonic receiver (network analyzer, VNA), (40) which typically has two synchronized (coherent) internal signal sources (41) and (42), which generate a signal at the operation frequency (Fo) also called "fundamental" frequency. Their relative phase is adjustable but constant during a power reading and their relative amplitude can also be adjusted (see ref. 7 and 8). Some network analyzers have more than two internal signal sources which can be adjusted to generate harmonic coherent signals at 2Fo, 3Fo (see ref. 7 and 8). The main signal (41) is injected into the input port of the DUT (43) via a signal boosting amplifier (44), and through an electromechanical slide screw impedance tuner (45) and a low loss bi-directional coupler (46); the forward coupled port of the coupler is connected to a detector (R1) and the reverse coupled port to a detector (D1) of the (40) VNA; the detectors allow measuring the forward and reverse travelling waves a1 and b1 at the input and the waves a2 and b2 at the output, and thus the injected power into the DUT and its input impedance Zin (or reflection factor Γin). The injected power at the DUT input port is defined as Pin=$|a1|^2$ (eq. 1) and the input impedance (reflection factor Γdut) as: Γdut=b1/a1 (eq. 2). The power delivered from the output of the DUT to the load is defined as Pdut=$|b2|^2$ (eq. 3) and the total reflection factor seen by the DUT at its output port is Γload=a2/b2 (eq. 4). In fact the total power injected into the output port of the DUT from the load is: Ptotal=Prefl+Pinj (eq. 5), whereby Prefl is the power reflected at the passive tuner (47) and Pinj is the power coming from the second source (42) after being amplified by the amplifier (48). The output of the amplifier (48) is protected using a circulator (49) which has its third port terminated (401), operating thus as an isolator. Since Pinj can be adjusted in amplitude and phase a condition can be reached, whereby the reflected power Ptotal is equal or higher that the power generated by the DUT (Pdut), thus resulting in a total reflection factor which can reach 1 ($|\Gamma total|\leq 1$) or be even higher than 1 ($|\Gamma total|>1$) (eq. 6); this is the purpose of the prior art active injection tuning using two synchronized signal sources (41), (42) and two power amplifiers (44), (48). An alternative configuration uses an active load (see ref. 6) but is irrelevant for this invention.

Takayama (see ref. 3) introduced the first split signal load pull system (FIG. 11); however Takayama teaches a low pass filter between the DUT and the active load, ie. He excludes control of the harmonic load impedances. Also Takayama's split signal load pull system is purely active and does not comprise a passive wideband or harmonic load tuner.

This invention discloses a hybrid split signal active injection load pull setup and method allowing operation using a single signal source and an adjustable coupler (wave-probe) as part of the input tuner which is replacing the signal divider (splitter) the phase shifter and the adjustable attenuator in the feedback loop, all in one.

BRIEF DESCRIPTION OF THE DRAWINGS

The invention will be better understood through the figures included as follows:

FIG. 6 depicts prior art, a perspective view of a wave-probe.

FIG. 7A through 7B depict prior art, FIG. 7A depicts the symbolic definitions of the wave-probe ports; FIG. 7B depicts measured coupling (1→3) and isolation (2→3) plots of a wave-probe over frequency.

FIG. 8A through 8B depict prior art; FIG. 8A depicts a power splitter/combiner; FIG. 8B depicts a view of a RF tuning probe inside a slabline.

FIG. 11 depicts prior art, the original split signal setup of Takayama (see ref. 3).

DETAILED DESCRIPTION OF THE INVENTION

Figure 5:
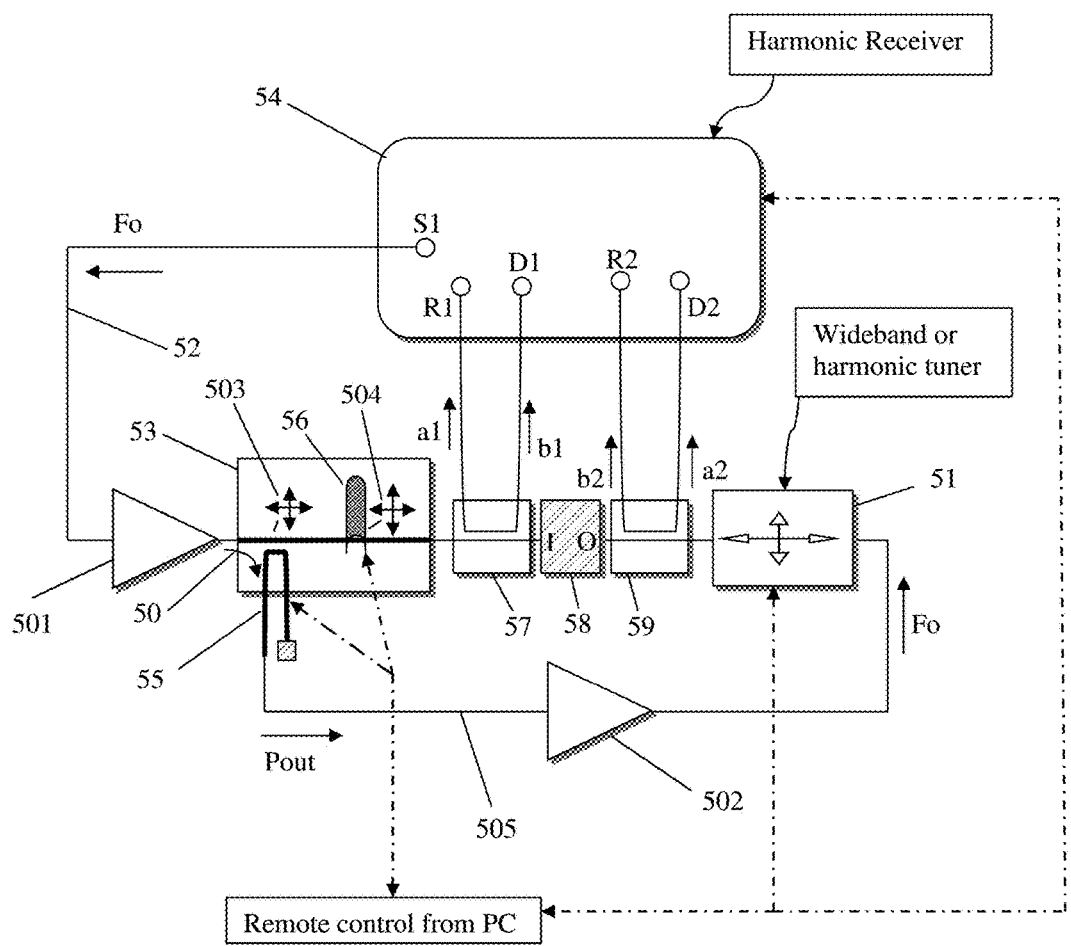
FIG. 5 depicts the split signal hybrid load pull system using a single source VNA and signal splitting, amplitude and phase control of the feedback signal using an adjustable wave-probe as part of the input tuner.

The split signal active injection setup is shown in FIG. 5. It comprises the wideband harmonic receiver (54), generating a signal at the fundamental (operating) frequency Fo (52) and a power amplifier (501) boosting the signal. The signal traverses the input tuner (53), a bi-directional signal coupler (57) and enters into the DUT (58) input port (I). The coupled ports of coupler (57) sample part of the forward a1 and reverse b1 travelling waves and injects them into the test ports (detectors R1, D1) of the VNA (54); the signal extracted from the output port (O) of the DUT (58) traverses a second bi-directional coupler (59), whose coupled ports inject samples of the exiting b2 and returning a2 signals into the other two test ports (R2, D2) of the VNA (54); An impedance tuner (51) is connected at the output port of the coupler (59); tuner (51) can be a single probe wideband tuner, or can be a two-or-three probe harmonic tuner, depending on the application. In all cases the concept is the same: Reverse signal is injected only at Fo in this configuration; if the tuner (51) is wideband, the system will allow impedance control only at the fundamental frequency (Fo). If tuner (51) is a harmonic tuner, then the system will allow hybrid (active plus passive) tuning at Fo and passive only harmonic tuning at 2Fo (and 3Fo..) as well.

Figure 10:
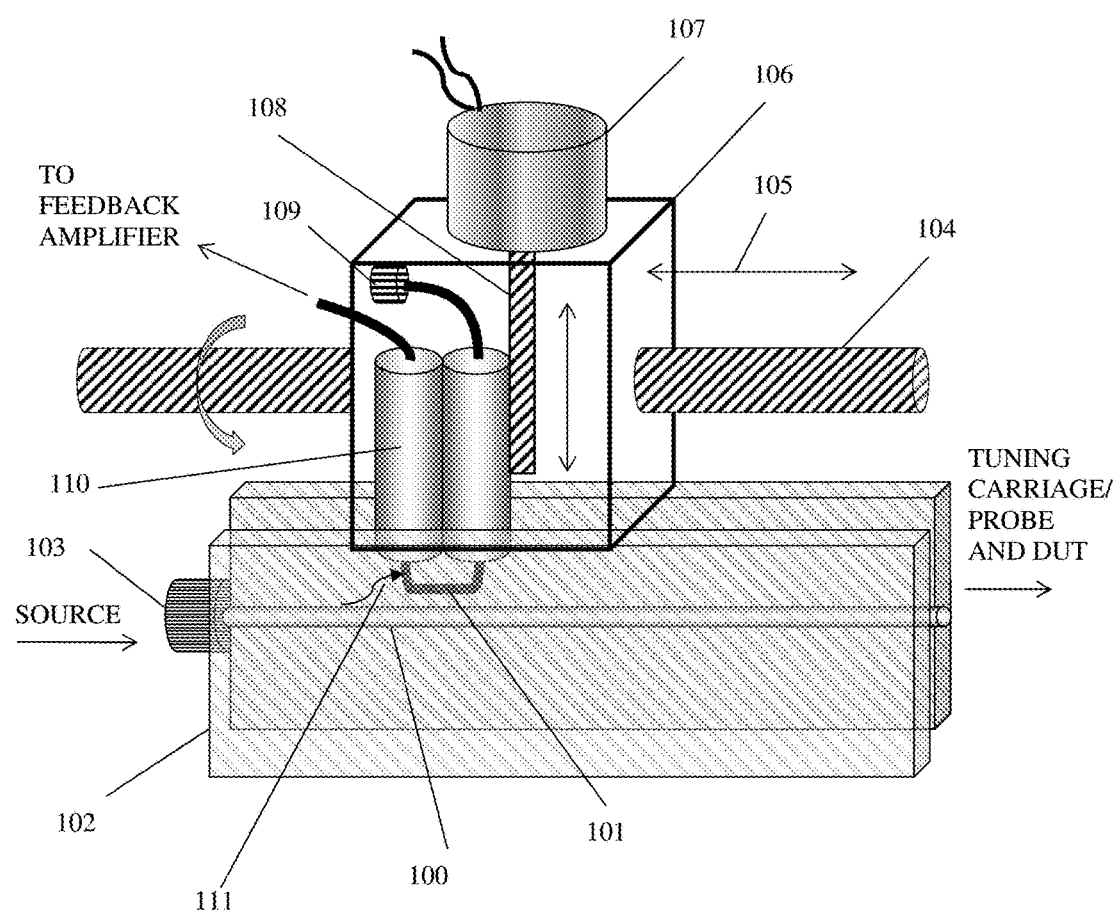
FIG. 10 depicts the coupling section detail (adjustable wave-probe) of the input tuner.

Further on, tuner (53) is a combination unit; it comprises at least two mobile carriages remotely controlled and sliding along its slabline. Both carriages have remotely controlled vertical axes. The carriage closest to the signal source port has a wave-probe (110), attached to its vertical axis (FIG. 10); the wave-probe is attached to the vertical axis (108) of the carriage (106) and is controlled by the stepper motor (107). Horizontally (105) the carriage is controlled by the acme rod (104). The wave probe comprises a magnetic loop (101) which is coupled with the center conductor (100) of the slabline (102). The coupled port of the wave-probe extracts an adjustable portion (111) of the signal injected into port (103) by the signal source and feeds (505) it into the feedback amplifier (502). The isolated port of the wave-probe is terminated with Zo (109) typically 50 Ohm. Moving the axis with the wave-probe vertically changes coupling (FIG. 7), i.e. the amplitude and moving horizontally changes the phase of the coupled portion (111). The tuning probe(s), FIG. 7B, are attached to vertical axes of further, prior art carriages, which are placed towards the DUT, (56) in FIG. 5.

The other carriage (or carriages) carry capacitively coupled conductive tuning probes (56), FIG. 8B; all carriages and vertical axes are independently adjustable horizontally and vertically (503, 504) correspondingly; whereas controlling the tuning probe creates an amplitude and phase controlled reflection factor which is presented to the DUT (58), the control of the wave-probe (55) implements three functions: a) it splits the injected signal by sampling (50) part of the signal; b) adjusts the amount of the sampled signal by varying vertical (coupling) position and c) adjusts the phase of the sampled signal by varying its horizontal (phase) position and thus creates an amplitude and phase controlled signal component (505), which is injected into amplifier (502) and after that into the output port of the DUT (58) through the output tuner (51). All carriages and axes of tuners (53) and (51) are remotely controlled by the external PC controller, which also communicates with the VNA (54) for configuration and data collection.

Figure 1:
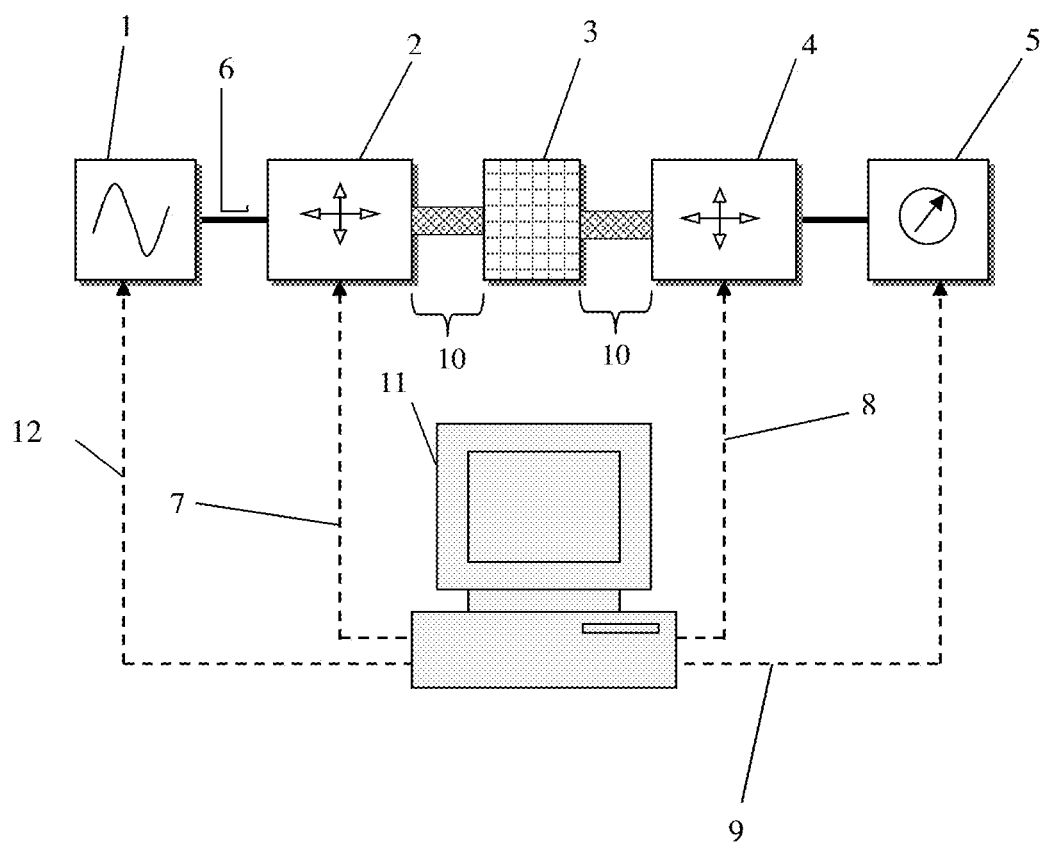
FIG. 1 depicts prior art, a typical automated load pull test setup using passive tuners only and emphasis on insertion loss between tuners and DUT.
Figure 2:
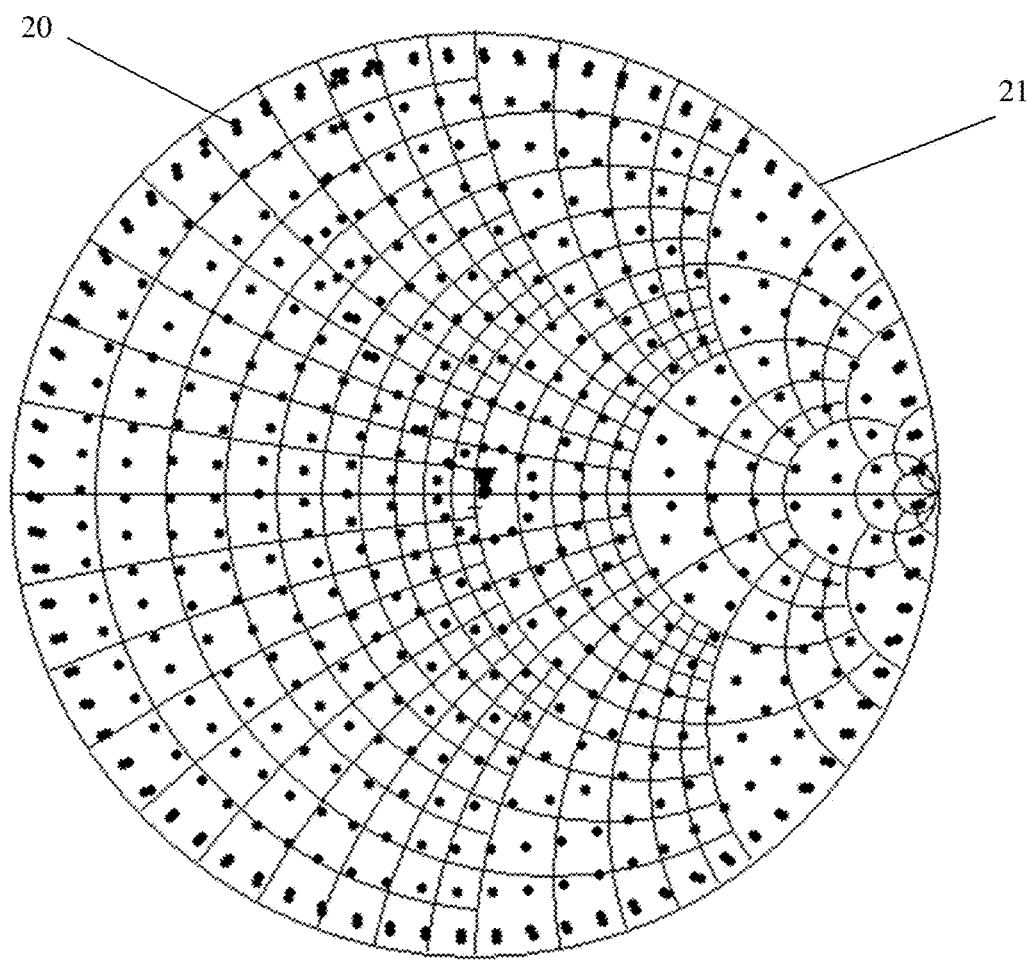
FIG. 2 depicts prior art, the distribution of calibration points in passive slide screw tuners on the Smith chart.
Figure 3:
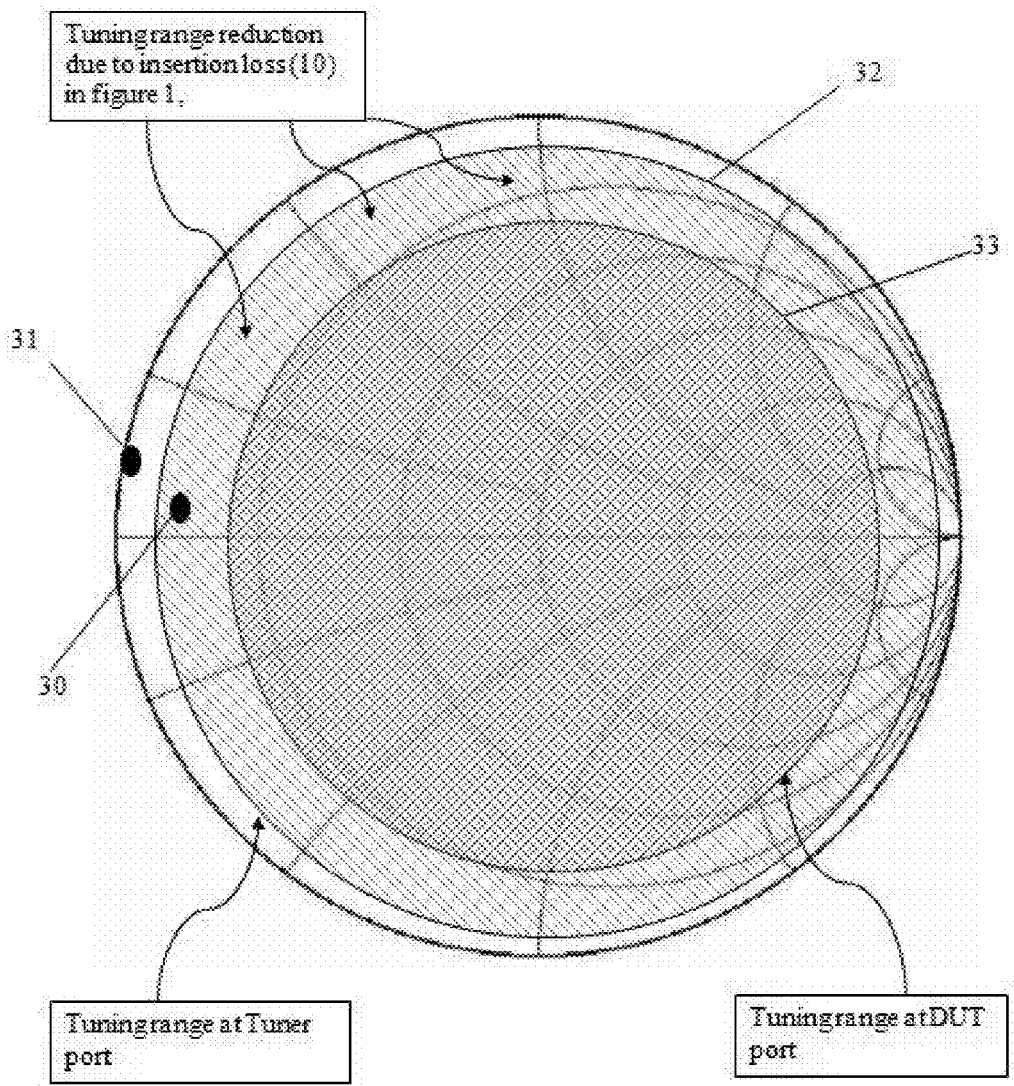
FIG. 3 depicts prior art, the reduction of tuning range (tuning dynamics) of passive tuners due to insertion loss between the tuner and the DUT.

Amplitude and phase control of the feedback signal (505) is critical. In prior art this would be done using additional amplitude and phase modulators in the feedback loop (see ref. 14); In this invention the adjustable wave-probe allows amplitude control of the forward coupling (S31, FIG. 7) by adjusting the penetration (70) of the wave-probe (FIG. 6) into the slabline slot. The use of the adjustable wave-probe (55) simplifies and enhances the solution for a number of reasons: a) it is fully compatible with the tuner mechanics and control, thus avoiding additional control electronics, that would be necessary if commercial attenuators and phase shifters were used; b) it has a bandwidth compatible with the tuner probe of several octaves, which commercially available components do not; and c) would the alternative solution (see ref. 14) of circulator combined with tuner be used, then the circulator would limit the bandwidth to one octave (Fmax/Fmin=2) only. Using the adjustable wave-probe the actual reflection factor seen by the DUT at its output port can be modified, without moving the tuner (51), creating an adjustable virtual load. The tuner (51) acts, in fact, as a pre-matching unit reducing the amount of power needed from the feedback amplifier (502) to reach the reflection factor (31) matching the DUT (see FIG. 3). Harmonic frequency active impedance control, though, is a different issue. The setup of FIG. 5 allows active tuning only at Fo. For active harmonic signal injection, one would need a setup as in FIG. 9; this will be discussed further down.

The proposed load pull setup is a closed loop system. This means the impedance information is measured (a1, b1, a2, b2) on-line by the VNA (54) and saved together with power, gain efficiency etc. If the setup calibration and reference plane corrections are done properly, this method is the most accurate possible, because moving parts (like the tuner probes) do not need to be perfectly repeatable, as is the case in open loop (passive) systems in which case the tuner shall reproduce the impedance saved in the calibration file, which is a purely mechanical problem. On the other hand active systems depend on linearity of the used power amplifiers (502) and can therefore not be calibrated for more than one input power, which is not worth the effort. Passive systems can also be used in closed loop: this is the case here: the passive impedance at the output at the harmonics is measured through a2 and b2 at those frequencies (a2 and b2 comprise harmonic components, generated by the DUT (b2) and the harmonic load (a2)).

The (preferably low loss) bi-directional coupler (59) is connected at the output port (O) of the DUT. The forward (a1, b2) and reverse portions (a2, b1) of the travelling waves, which are sampled by the coupled branches of the couplers (57) and (59) and are injected into the forward and reverse test ports of the receiver, associated with the R and D detectors, allow measurement of the associated traveling waves ai and bi, whereby $\{i\}=\{1,2\}$; the signal exiting from the DUT output port (O) through the output directional coupler (59) is partially reflected at a load impedance tuner (51); in a first embodiment the tuner (51) is a single probe wideband (also called fundamental) automated slide screw impedance tuner. In a further embodiment, the tuner (51) is a multi-carriage multi-probe harmonic tuner (see ref. 12); in both cases the only difference is the calibration of the VNA which should read a2 and b2 at Fo, 2Fo, 3Fo . . . If this is not possible, the harmonic impedance can be entered into the system from the calibration of the harmonic tuner (51) in which case the system is operated in closed loop at Fo and open loop at 2Fo, 3Fo, . . .

Figure 4:
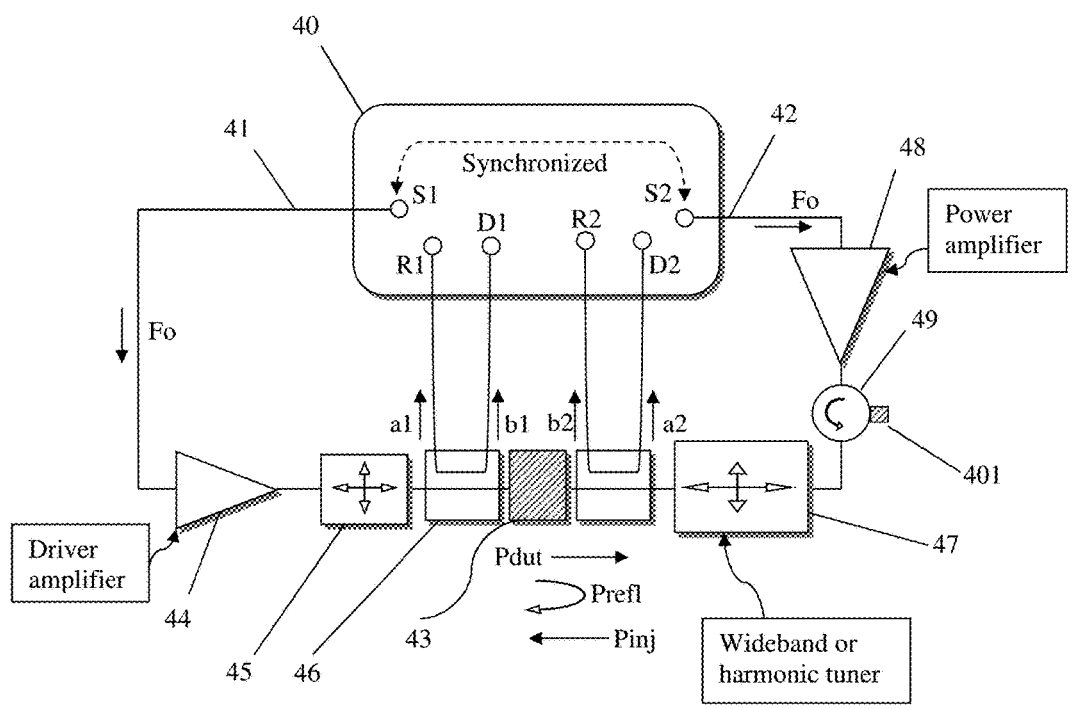
FIG. 4 depicts prior art, a schematic structure of a hybrid open loop active injection load pull setup and the associated nomenclature. This setup allows active feedback injection at the fundamental frequency (Fo) and the possibility of independent passive harmonic tuning, if a harmonic tuner (47) is used.

In further embodiments, multi-probe harmonic tuners (see ref. 12) are used: in a second embodiment, the tuner (51) is a two-probe two-harmonic frequency tuner and in a third embodiment it is a three-probe three-harmonic frequency tuner. In all cases the fundamental frequency is also processed by the tuner (51) whereas a two-probe tuner processes (controls the impedance) at two frequencies (Fo and 2Fo or Fo and 3Fo) and a three-probe tuner controls the impedances at three frequencies (Fo, 2Fo and 3Fo) independently. This tuning allows an impedance adaptation (pre-matching) between the 50Ω output impedance of the amplifier (502) and the low output impedance of the DUT at its output port (O), which may range between 0.5 and 5 Ω (see FIG. 3). This pre-matching allows reducing the power requirement of the amplifier (502). The injected signal from the amplifier (502) is overlapped with the signal Prefl returned to the DUT after being reflected at the input port of the tuner (51) following the mechanism outlined in FIG. 4; hereby the total power Ptotal=Prefl+Pinj is injected into the DUT output port (O); since the power Pinj delivered by the amplifier (502) can be adjusted by the wave-probe (55) in amplitude and phase, such as to arrive at the DUT output port in-phase with the passively reflected signal Prefl, it follows that the reflection factor $\Gamma_{load}$=a2/b2, can be manipulated at will, and even be made >1. Thus we have a setup in which the controlled reflection factor presented to the DUT at its output port can reach 1, using only a single signal source and an adjustable wave-probe.

Figure 9:
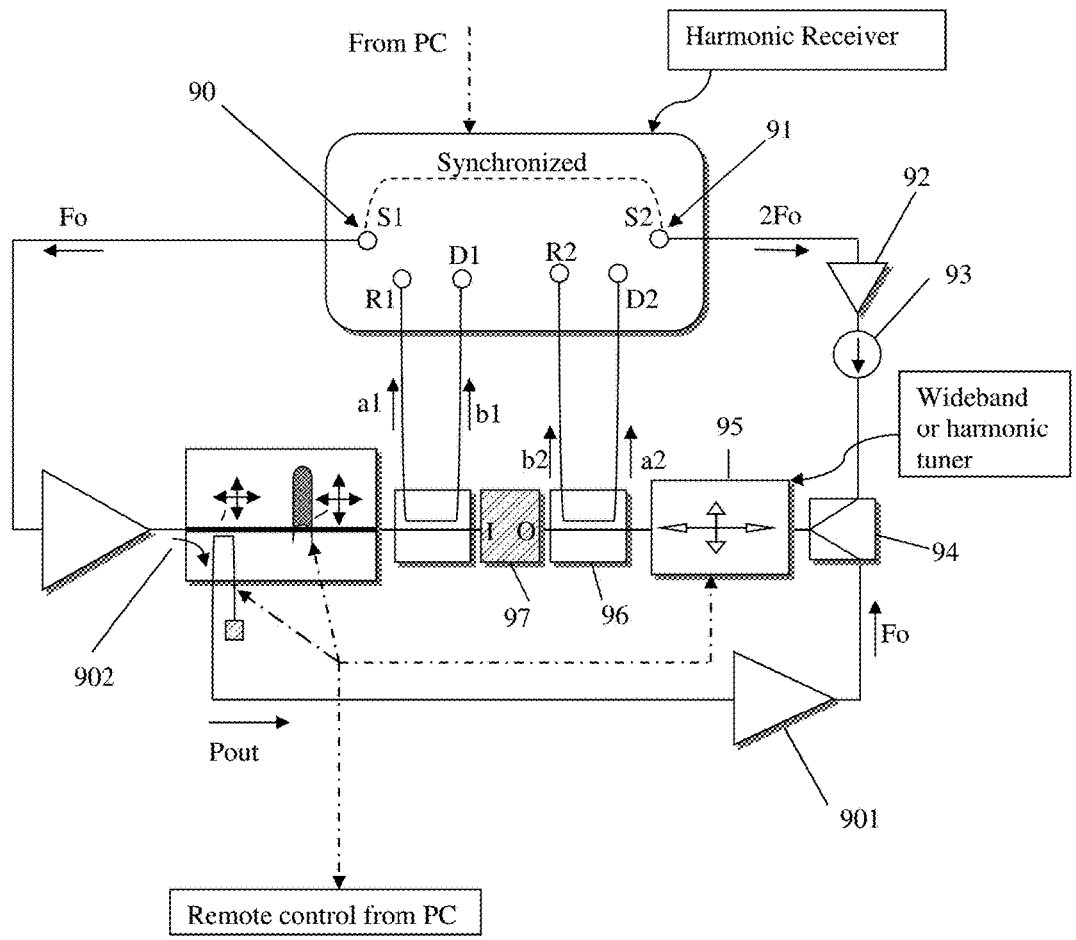
FIG. 9 depicts the split signal hybrid load pull system using a dual source VNA and split of the injected signal and control of amplitude and phase of the feedback signal using an adjustable wave-probe, part of the input tuner.

In the case of harmonic active injection, a second synchronized signal source must be used (see ref. 5 and FIG. 9). FIG. 9 shows the harmonic injection setup embodiment, whereby the harmonic signal generated by the synchronized second source S2 (91) of the harmonic receiver; the harmonic signal (2Fo) is independently controlled in amplitude and phase, compared with the primary signal from source S1 (90) at Fo and can be amplified, if necessary, using a medium power amplifier (92) of which the output circuitry is normally protected from the signal generated by the DUT (97) using an isolator (93); the harmonic receiver generator S2 has the capacity of controlling the amplitude and phase of the harmonic signal (2Fo); the harmonic signal is then combined with the signal at the fundamental frequency (Fo), coming from the amplifier (901), which amplifies the sample (902) from the main fundamental (Fo) signal path, using the power combiner (94) and both signals are injected into the output port (O) of the DUT (97) after passing through the output tuner (95) and the low loss coupler (96); the output tuner (95) itself is a multi-probe harmonic tuner (see ref. 12 and 13) allowing independent power reflection and pre-matching at each frequency (Fo and 2Fo). All other signal manipulations, calibrations and signal detection are as in such prior art test setups (see ref. 5).

In a first embodiment (FIG. 5) a setup is disclosed allowing active load pull at the fundamental frequency using a single source, adjustable wave-probe, amplifiers and wideband (fundamental) tuners. In a second embodiment the setup uses a passive harmonic output tuner. In a third embodiment (FIG. 9), the setup allows injecting power also at the harmonic frequency 2Fo, generated using the second source of the VNA.

This invention discloses a new split signal hybrid, fundamental and harmonic frequency, active injection load pull setup in a number of possible embodiments. Alternative non-essentially different configurations are imaginable, because of the numerous accessories used, but shall not impede on the originality of the disclosed preferred embodiments.

What I claim as my invention is:

1. A hybrid active and passive load pull test system, comprising:
   a vector receiver, at least one amplifier and
   a first signal source generating signal power at a test frequency Fo; and, in a signal path following the first signal source, a cascade of,
   a) a directional coupler comprising a wave-probe, the wave-probe being remotely adjustable in phase and amplitude,
   b) an input impedance tuner,
   c) an input bi-directional coupler,
   d) a DUT in a test fixture,
   e) an output bi-directional coupler, and
   f) an output impedance tuner,
   whereby
      the wave-probe has an input port, an output port, a coupled port and an isolated port and whereby the isolated port is terminated with characteristic impedance Zo;
   whereby
      the signal power from the first signal source is divided into an input portion and an output portion,
      and the input portion is injected into an input port of the DUT and the output portion is injected into an output port of the DUT,
   whereby
      the output portion is extracted from the signal path, before the input impedance tuner, by coupling into the coupled port of the wave-probe, amplified by a first amplifier of the at least one amplifier and injected into the output port of the DUT through the output impedance tuner,
   and whereby
      forward and reverse travelling signal power waves are sampled before the input port of the DUT and after the output port of the DUT using the input and output bi-directional couplers, and the sampled forward and reverse travelling signal power waves are injected into forward and reverse test ports of the vector receiver, which is synchronized with the first signal source.

2. The test system as in claim 1, whereby the input and output impedance tuners are automated and whereby the input impedance tuner is inserted immediately before the input bi-directional coupler and the output impedance tuner is inserted immediately after the output bi-directional coupler.

3. The test system as in claim 2, whereby the output impedance tuner is a single probe wideband tuner.

4. The test system as in claim 2, whereby the output impedance tuner is multi-carriage multi-probe harmonic tuner and the vector receiver is a harmonic vector receiver.

5. The test system as in claim 3 or 4, whereby the wave-probe comprises a magnetic loop coupled to a center conductor of a slabline and is incorporated inside the input impedance tuner,
whereby
   the input impedance tuner has an input port, an output port and a slot defined by the slabline between the input and output ports of the tuner and at least two remotely controlled carriages movable horizontally along an axis of the slabline, each having a remotely controlled vertical axis;
whereby
   the input port of the input impedance tuner is closer to the first signal source than the output port of the input impedance tuner;
whereby
   the wave-probe is attached to the vertical axis of the carriage which is closest to the input port of the input impedance tuner; and
whereby
   the magnetic loop of the wave-probe is remotely insertable into the slot of the slabline of the input impedance tuner to control a coupling factor; and whereby the vertical axis of the carriage closest to the output port of the input impedance tuner carries a RF tuning probe.

6. The system as in claim 5, whereby the power from the first signal source is amplified by a second amplifier of the at least one amplifier before being divided into the input and output portions and whereby the output portion is amplified independently by the first amplifier.

7. The system as in claim 5, whereby an amplitude of the output portion of the power from the first signal source is controlled by the penetration of the magnetic loop of the wave-probe into the slot of the slabline of the input impedance tuner and the phase of the output portion of the power from the first signal source is controlled by moving the carriage holding the wave-probe along the slabline.

8. The test system as in claim 1 further comprising a second signal source generating power at a test frequency 2Fo, synchronized with the first signal source, said second signal source having independently controlled amplitude and phase, the second signal source injecting power into the output port of the DUT through the output impedance tuner, whereby the power at Fo, coming from the coupled port of the wave-probe, and the power at 2Fo, coming from the second signal source, are combined before traversing the output impedance tuner in a direction of the DUT output port.

* * * * *